US006960306B2

(12) United States Patent
Iggulden et al.

(10) Patent No.: US 6,960,306 B2

(45) Date of Patent: Nov. 1, 2005

(54) LOW CU PERCENTAGES FOR REDUCING SHORTS IN ALCU LINES

(75) Inventors: Roy C. Iggulden, Newburgh, NY (US); Padraic Shafer, Fishkill, NY (US); Kwong Hon (Keith) Wong, Wappingers Falls, NY (US); Michael M. Iwatake, Wappingers Falls, NY (US); Jay W. Strane, Chester, NY (US); Thomas Goebel, Munich (DE); Donna D. Miura, Hopewell Junction, NY (US); Chet Dziobkowski, Hopewell Junction, NY (US); Werner Robl, Poughkeepsie, NY (US); Brian Hughes, San Jose, CA (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 92 days.

(21) Appl. No.: 10/207,773

(22) Filed: Jul. 31, 2002

(65) Prior Publication Data

US 2004/0020891 A1 Feb. 5, 2004

(51) Int. Cl.[7] ................................................ H01L 21/00

(52) U.S. Cl. ............................ 216/13; 216/67; 216/77; 216/78; 438/710; 438/717; 438/720

(58) Field of Search ............................. 216/13, 47, 67, 216/77, 78; 438/710, 717, 720

(56) References Cited

U.S. PATENT DOCUMENTS 5,071,714 A * 12/1991 Rodbell et al. ............. 428/620
5,943,601 A 8/1999 Usui et al. .................. 438/688
6,291,336 B1 9/2001 Teng .......................... 438/627
2002/0119667 A1 * 8/2002 Okuni ........................ 438/706
2002/0142605 A1 * 10/2002 Kim .......................... 438/694

OTHER PUBLICATIONS

Clevenger, et al., "Al Deposition Temperature Process Window for 0.20 μm Al RIE Interconnections," Interconnect Technology, 1999 IEEE International Conference, May 24–26, 1999, pp. 29–31.

Kwok, "Effect of metal line geometry on electromigration lifetimes in Al–Cu submicron interconnects," Reliability Physics Symposium 1998, 26th Annual Proceedings, International, Apr. 12–14, 1998, pp. 185–191.

Ryan, et al., "The evolution of interconnection technology at IBM," IBM Journal of Research and Development, vol. 39, No. 4, Jul. 1995, pp. 1–9.

* cited by examiner

*Primary Examiner*—Allan Olsen
(74) *Attorney, Agent, or Firm*—Slater & Matsil, L.L.P.

(57) ABSTRACT

In a method of fabricating a metallization structure during formation of a microelectronic device, the improvement of reducing metal shorts in blanket metal deposition layers later subjected to reactive ion etching, comprising:

a) depositing on a first underlayer, a blanket of an aluminum compound containing an electrical short reducing amount of an alloy metal in electrical contact with the underlayer;

b) depositing a photoresist and exposing and developing to leave patterns of photoresist on the blanket aluminum compound containing an electrical short reducing amount of an alloy metal; and c) reactive ion etching to obtain an aluminum compound containing an alloy metal line characterized by reduced shorts in amounts less than the aluminum compound without said short reducing amount of alloy metal.

10 Claims, 5 Drawing Sheets

LOW CU PERCENTAGES FOR REDUCING SHORTS IN ALCU LINES

BACKGROUND OF THE INVENTION

1. Field of the Invention

The invention relates to use of low percents by weight of Cu in AlCu lines to improve functional yield by substantially reducing metal shorts for blanket metal deposition layers that are later subjected to reactive ion etching (RIE), when making microelectronic devices.

2. The Prior Art

Advances in interconnection technology have allowed continued improvements in integrated circuit density, performance and electrical characteristics, and this has led to a steady decline in the price per bit for dynamic random access memories (DRAMs).

In this connection, aluminum and aluminum alloys are used to form various electrical connections or wiring in electronic devices, such as integrated circuit structures. The aluminum or aluminum alloys are used to form the electrical connections between active and/or passive devices of the integrated circuit structures. For example, in fabricating a metallization structure, it has been the practice to use aluminum or an alloy thereof electrically connected to an underlying substrate, such as silicon. Although the aluminum and silicon are electrically connected together, the practice is to use intermediate electrically conducted layers interposed between the silicon and aluminum to provide better electrical connection to the silicon and to provide a physical barrier between the silicon and aluminum. This is for the purpose of preventing electromigration and spiking of the aluminum into the silicon, since migration of aluminum atoms into the underlying silicon can interfere with the performance and reliability of the resulting integrated circuit structure.

In addition to electromigration, the problem of hillock growth also occurs. These problems are especially pronounced at the submicron level. Further, as the demand increased for scaling down the dimensions of the interconnection lines and for increasing the current density, minimizing electromigration and hillock growth, improving functional yield was accomplished by alloying Cu in amounts of >2 weight-percent (wt %) to form AlCu lines. However, as the linewidth decreases, Cu defects become more critical to functional yield in AlCu RIE lines when performing blanket metal deposition followed by RIE when fabricating micro electronic devices—such that even when Cu is present in an amount of 0.5 wt %, excessive metal shorting occurs.

IBM Journal of Research and Development Vol. 39, No. 4, Jul. 19, 1995, pg. 4 disclose the use of AlCu alloy wiring innovation for enhancing reliability. Enhancing reliability included alleviating electromigration associated with AlSi metallurgy. Reliability is further enhanced by the use of thin layers of refractory metals, including the use of Ti, above and below the AlCu alloy layers. The refractory metals reduce contact resistance and provide an immobile redundant layer capable of shunting currents over small voids, thereby improving electromigration and stress-migration resistance.

A process of fabricating a metallization structure is disclosed in U.S. Pat. No. 5,943,601. The process comprises:

depositing onto a substrate a first layer of titanium having a thickness of about 90 to 110 angstroms; and then depositing a layer of aluminum and/or an aluminum alloy whereby the layer of aluminum and/or aluminum alloy is in electrical contact with the layer of the group IVA metal. The process of the present invention provides a metallization structure that exhibits enhanced electromigration characteristics along with being highly textured and being free of hillocks.

The process may use AlCu.

U.S. Pat. No. 6,291,336 B1 disclose the use of AlCu metal deposition for robust RC via performance. The method deposits a metal layer on a semiconductor substrate, and comprises:

providing a silicon substrate having a first metal layer;
depositing an insulating layer over the metal layer;
forming via holes in the insulating layer;
performing a sputter etch cleaning of the via holes;
depositing a barrier layer in the via holes;
depositing a film of second metal over the barrier layer, wherein the second metal is aluminum copper alloy, wherein the second metal is deposited at a temperature between about 40° C. to 80° C., and wherein the thickness of the second metal is between about 6,000 to 6,600 Å; and
depositing an anti-reflective coating onto said film of metal.

L. A. Clevenger et al. in Interconnect Technology, 1999. IEEE International Conference, pgs. 29–31 disclose a process window for a Al(Cu) deposition temperature for a 0.2 /spl $\mu$/m wide, 0.44 /spl $\mu$/m pitch, Al RIE interconnection used in a 256 Mbit DRAM. While surface roughness and Al texture degrade slightly with increasing deposition temperature, other properties like RIE etchability, /spl Theta/-$Al_2Cu$ precipitate distribution and texture, sheet resistance and opens/shorts yield either improve or are unaffected as the Al deposition temperature is increased. All of these parameters combine to suggest a wide process window for Al deposition temperature for 0.2 /spl $\mu$/m Al RIE interconnections.

T. Kwok in Reliability Physics Symposium 1988. $26^{th}$ Annual Proceedings., International, pgs. 185–191 disclose the dependence of electromigration lifetime on the metal line geometry in Al—Cu of electromigration lifetime on the metal line geometry in Al—Cu submicron lines. The results indicated that as the linewidth decreases, the lifetime initially decreases and then increases below a crucial width. The lifetime also decreases with increasing film thickness. Those Al—Cu submicron lines with linewidth comparable to or smaller than film thickness have a longer electromigration lifetime than other Al—Cu fine lines. The effect of line length on electromigration lifetime was found to be small.

There is a need when utilizing AlCu metallization schemes for blanket metal deposition layers subjected to reactive ion etchings, to lessen or eliminate poor functional yield, poor process window and numerous Cu rich defects during microelectronic fabrication.

SUMMARY OF THE INVENTION

One object of the present invention is to provide an AlCu metallization scheme for blanket metal deposition layers subjected to reactive ion etching that lessens or eliminates poor functional yield, a poor processing window and numerous Cu rich defects during microelectronic fabrication.

Another object of the present invention is to provide an AlCu metallization scheme for blanket metal deposition layers subjected to reactive ion etching, that uses Cu percentages lower than is normally the case in AlCu lines to improve functional yield during microelectronic fabrication.

A further object of the present invention is to provide an AlCu metallization scheme for blanket metal deposition layers subjected to reactive ion etching that decreases the Cu percentage in the linewidth wherein the functional yield is markedly improved by reducing the metal shorts.

In general, the invention is accomplished by:

a) depositing on a first underlayer, a blanket of an aluminum compound containing an electrical short reducing amount of an alloy metal in electrical contact with said underlayer;

b) depositing a photoresist and exposing and developing to leave patterns of photoresist on the blanket aluminum compound containing an electrical short reducing amount of an alloy metal; and c) reactive ion etching to obtain an aluminum compound containing an alloy metal line characterized by reduced shorts in amounts less than said aluminum compound without said short reducing amount of alloy metal.

In a second embodiment of the invention process, in step b) an anti-reflective coating (ARC) is deposited followed by depositing the photoresist and exposing and developing to leave said patterns.

DETAILED DESCRIPTION OF PREFERRED EMBODIMENT OF THE INVENTION

In the use of AlCu metallization schemes for blanket metal deposition layers subjected to reactive ion etching (RIE), it is known that, as the linewidth decreases Cu defects become more critical to the functional yield in AlCu RIE lines. These Cu defects can be a combination of theta precipitates ($Al_2Cu$), increased Cu at the TiN/AlCu interface, and/or increased Cu in the grain boundaries. The foregoing defects give rise to metal shorts or an unintended low resistance path through which current flows around, rather than through, a component.

By decreasing the Cu percentage in these lines, the functional yield is markedly improved by reducing the metal shorts.

Figure 1:
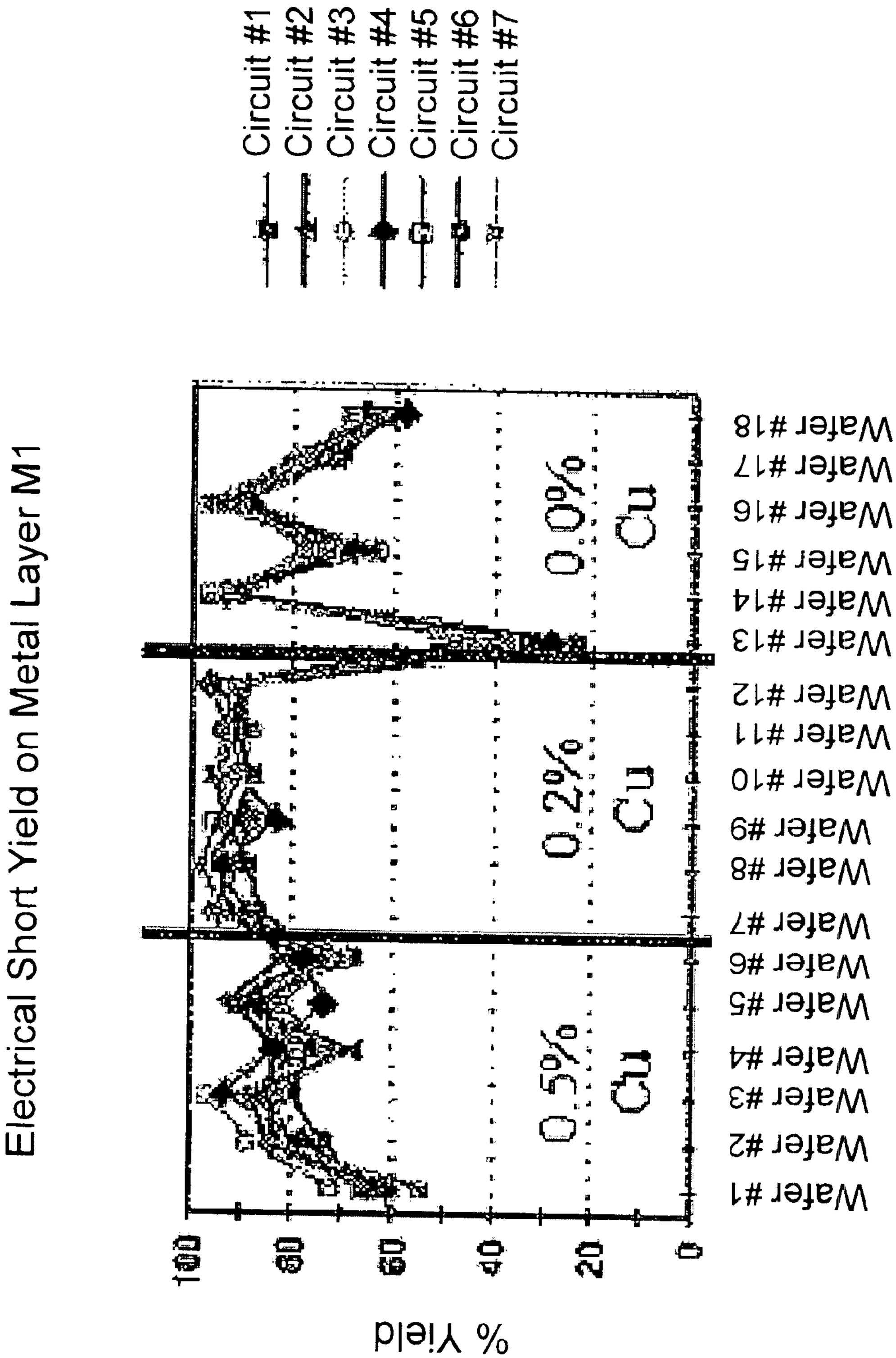
FIG. 1 is a graph showing metal shorts versus Cu percentage for a non-reworked lot.
Figure 2:
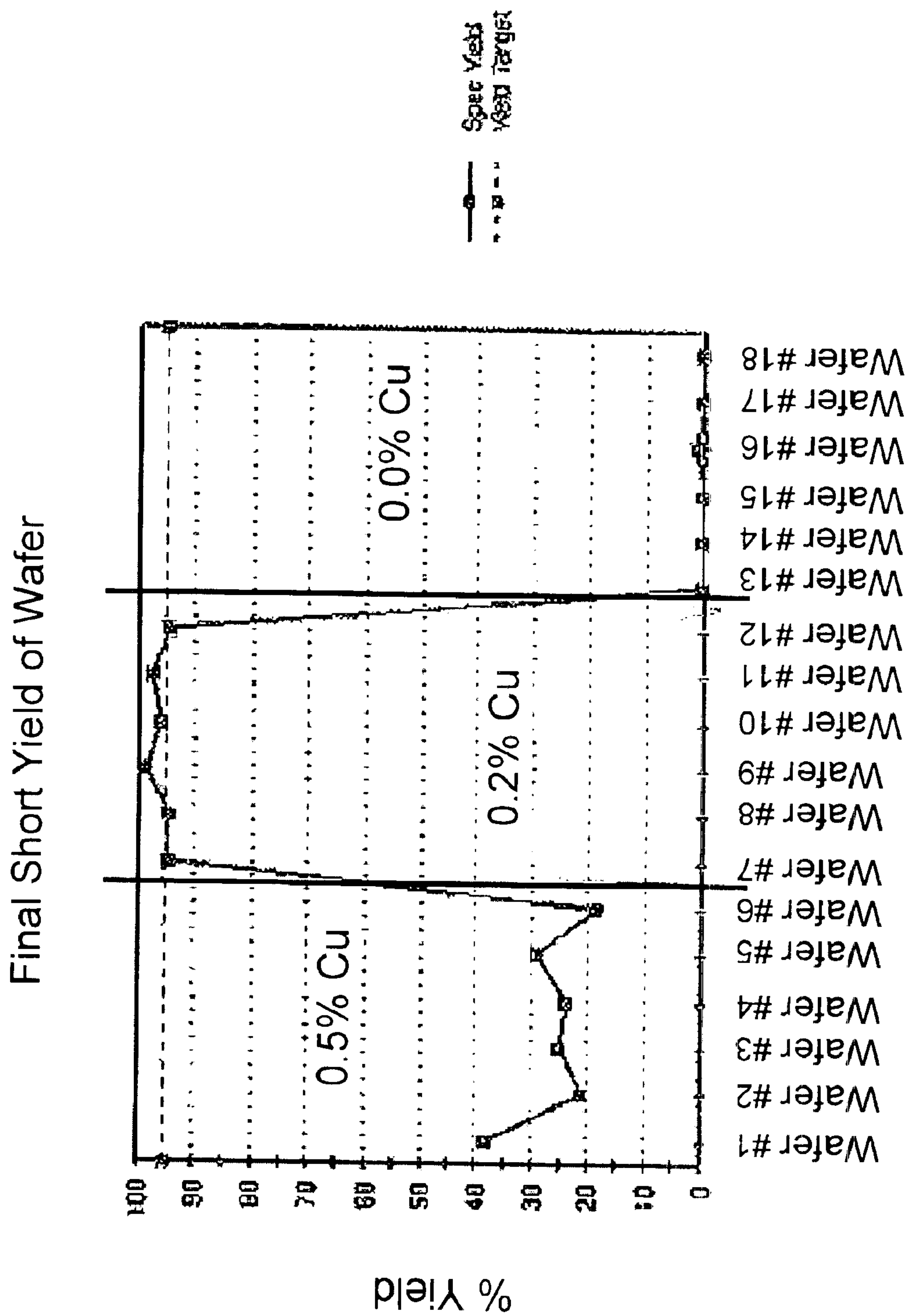
FIG. 2 is a graph showing metal shorts versus Cu percentage for a lot that has been reworked twice.

Reference is now made to FIGS. 1 and 2 to illustrate the aforementioned functional improvement.

FIG. 1 is a graph showing metal shorts versus Cu percentage for a non-reworked lot, whereas FIG. 2 is a graph showing metal shorts versus Cu percentage for a lot that has been reworked twice.

The lower Cu percentage increases the process window of any necessary rework. In this connection, it should be noted that rework typically aggravates the Cu shorting mechanism in standard RIE schemes, prior to etching. Therefore, the lower Cu percentage becomes even more critical when a rework or multiple reworks are necessary. This is evident by reference to FIGS. 1 and 2, wherein it is evident that the 0.2 percent Cu shorts yield did not change after two reworks; however, the 0.5 percent Cu shorts yield fell from nearly 85% to under 40%.

It is apparent that the lower Cu percentage limits the number of Cu defects that can form, which is the major contributor to metal shorts.

Figure 3:
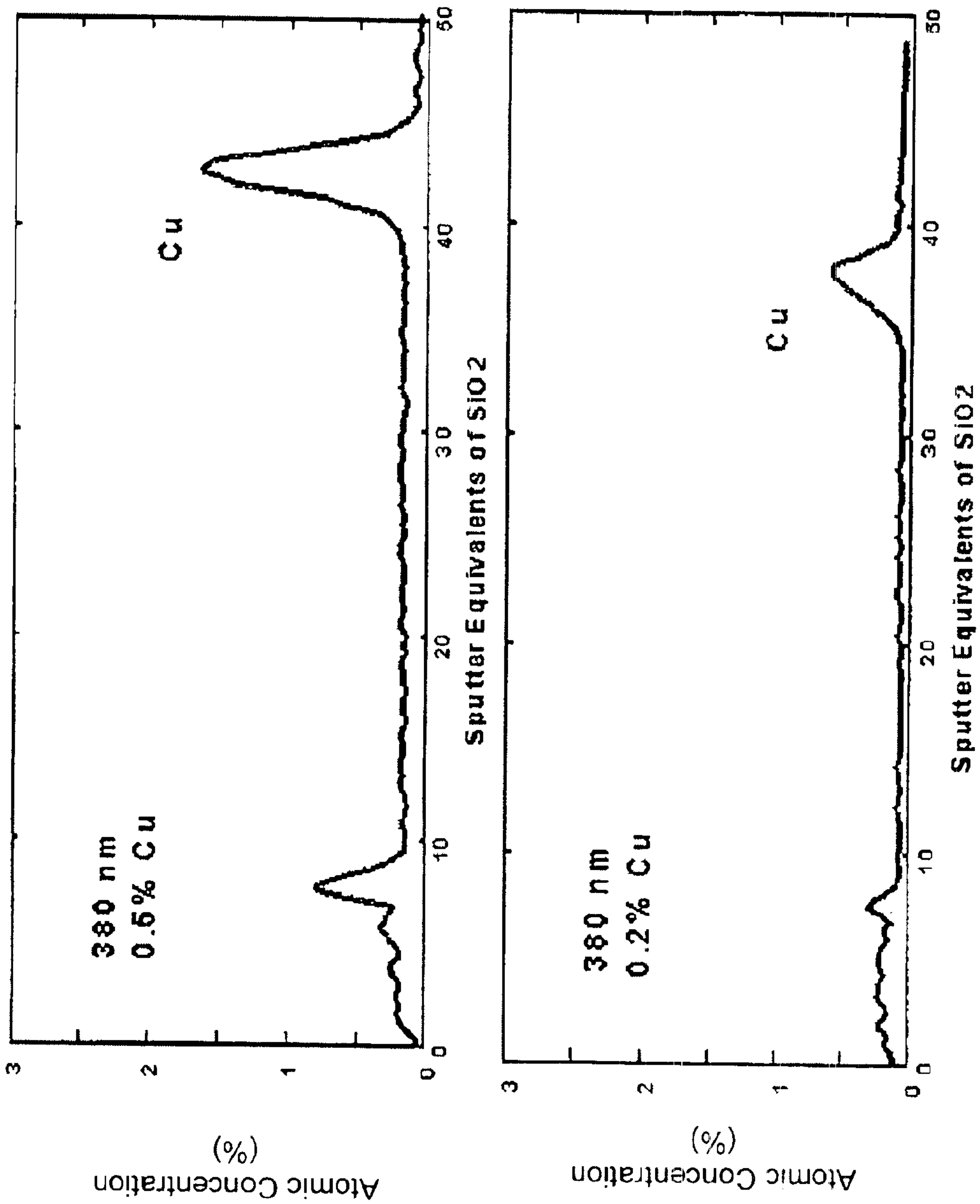
FIG. 3 are graphs showing atomic concentration percent versus sputter equivalents of $SiO_2$ at 380 nm for 0.5% Cu and 0.2% Cu.

To elucidate further, reference is made to FIG. 3 which shows graphs of atomic concentration percent versus sputter equivalents of $SiO_2$ at 380 nm for 0.5% Cu and 0.2% Cu. More specifically, these figures are Auger plots showing Cu concentration across the samples height for 0.5% Cu and 0.2% Cu. The sample consists of TiN on top, a flash of Ti, then AlCu, then TiN again, and then Ti. As can be seen, the first Cu peak on the left hand side of the graph is the Cu build-up on the top Ti/AlCu interface, and the Cu content is then constant across the AlCu until it reaches the large peak on the right hand side, which is at the AlCu/bottom TiN interface. It is apparent that, by lowering the Cu percent from 0.5% to 0.2%, there is a significant reduction of the bottom peak and an almost elimination of the top peak. In this connection, it should be noted that it is the Cu rich area where the Cu precipitate forms. This is apparent from FIG. 4 which is a SEM picture of etch blocks formed by Cu precipitates from the Cu rich area. These precipitates act as etch blocks during the subsequent metal RIE processing.

Figure 4:
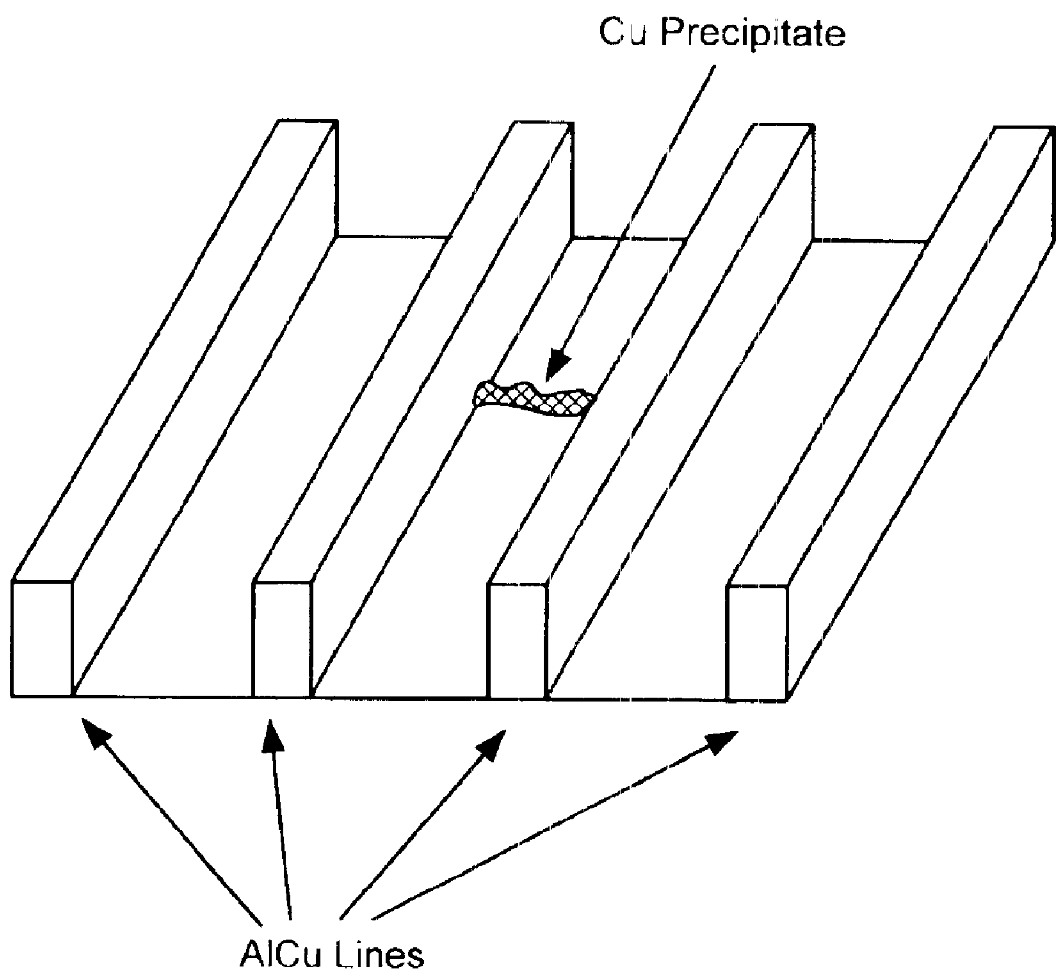
FIG. 4 is SEM picture of etch blocks formed by Cu precipitates from the Cu rich area.

Again, FIG. 4 is a picture of the etch blocks, and in FIG. 4, the AlCu lines are the white contrast where the spaces between the lines are dark. The short can be seen in the middle, and is a precipitate that did not etch.

Figure 5:
FIG. 5 is a SEM picture of a cross section of the AlCu lines after they are reactive ion etched.

FIG. 5 is a SEM picture of a cross section of the AlCu lines after they are reactive ion etched. The large middle part is AlCu and the top and bottom Ti and TiN's can also be seen.

It is to be understood that the AlCu metallization scheme for blanket metal deposition layers as specifically set forth is not limited to the described sequence, and may be used in any Al lines which are to be reactive ion etched and have Cu in them.

What is claimed is:

1. A method of fabricating a metallization structure, the method comprising the steps of:

depositing on an underlayer a blanket of an aluminum (Al) compound in electrical contact with said underlayer, the underlayer comprising a first TiN layer formed over a first Ti layer, the aluminum compound containing about 0.2% by weight of Cu;

depositing a photoresist and exposing and developing to pattern the aluminum compound; and reactive ion etching the aluminum compound.

2. The method of claim 1 wherein said depositing of the Al compound is chemical vapor deposition or physical vapor deposition.

3. The method of claim 1 wherein said depositing of the Al compound is physical vapor deposition.

4. The method of claim 1 wherein said depositing of the Al compound is sputter deposition.

5. The method of claim 1 wherein said photoresist includes use of an anti-reflective coating.

6. The method of claim 1 further comprising, prior to depositing the photoresist, depositing another layer over said blanket of aluminum compound, said another layer comprising a material selected from the group consisting of TiN and Ti.

7. The method of claim 1 further comprising, prior to depositing the photoresist, depositing a second Ti layer over said blanket of aluminum compound and a second TiN layer over said second Ti layer.

8. A method for fabricating a metallization structure for a microelectronic device, the method comprising the steps of:

depositing an underlayer, said underlayer comprising a layer of Ti covered by a layer of TiN;

depositing a blanket of an aluminum compound in electrical contact with said underlayer of TiN, the aluminum compound containing about 0.2% by weight of Cu;

depositing a top layer over said blanket of aluminum compound, said top layer comprising a layer of Ti covered by a layer of TiN;

depositing a layer of photoresist over said top layer;

exposing and developing said photoresist to form a pattern of photoresist on the blanket of aluminum compound; and reactive ion etching to form aluminum compound lines.

9. The method of claim 8 wherein said step of depositing blanket of aluminum compound is by sputter deposition.

10. The method of claim 8 wherein said layer of photoresist comprises an antireflective coating.

* * * * *